United States Patent
Wang

(10) Patent No.: US 10,126,895 B2
(45) Date of Patent: Nov. 13, 2018

(54) COVER PLATE AND MANUFACTURING METHOD THEREOF, AND MANUFACTURING METHOD OF DISPLAY DEVICE

(71) Applicants: BOE Technology Group Co., Ltd., Beijing (CN); Hefei BOE Optoelectronics Technology Co., Ltd., Anhui (CN)

(72) Inventor: Sheng Wang, Beijing (CN)

(73) Assignees: BOE Technology Group Co., Ltd., Beijing (CN); Hefei BOE Optoelectronics Technology Co., Ltd., Anhui (CN)

( * ) Notice: Subject to any disclaimer, the term of this patent is extended or adjusted under 35 U.S.C. 154(b) by 114 days.

(21) Appl. No.: 15/150,646

(22) Filed: May 10, 2016

(65) Prior Publication Data
US 2017/0075451 A1    Mar. 16, 2017

(30) Foreign Application Priority Data
Sep. 16, 2015 (CN) .......................... 2015 1 0591094

(51) Int. Cl.
*G06F 3/045* (2006.01)
*G06F 3/044* (2006.01)
(Continued)

(52) U.S. Cl.
CPC ............ *G06F 3/044* (2013.01); *G06F 3/0412* (2013.01); *H05K 3/06* (2013.01); *H05K 3/064* (2013.01);
(Continued)

(58) Field of Classification Search
CPC .................. G06F 3/044; G06F 3/0412; G06F 2203/04103; H05K 3/064; H05K 3/4644; H05K 3/06
See application file for complete search history.

(56) References Cited

U.S. PATENT DOCUMENTS

| 8,804,055 B2 | 8/2014 | Jun |
| 2009/0096759 A1* | 4/2009 | Nishiwaki ............... G06F 3/041 345/173 |

(Continued)

FOREIGN PATENT DOCUMENTS

| CN | 102163095 A | 8/2011 |
| CN | 202285071 U | 6/2012 |
| CN | 104750347 A | 7/2015 |

OTHER PUBLICATIONS

Aug. 31, 2017—(CN) Office Action application CN 201510591094.9 with English Translation.

*Primary Examiner* — Srilakshmi K Kumar
*Assistant Examiner* — Brent D Castiaux
(74) *Attorney, Agent, or Firm* — Banner & Witcoff, Ltd.

(57) ABSTRACT

A cover plate and a manufacturing method thereof, and a manufacturing method of a display device are disclosed. The cover plate including: a base, comprising a touch region and a press-fit region disposed outside the touch region; a touch pattern, being disposed in the touch region and the press-fit region; and a passivation layer pattern, being disposed on the touch pattern in the touch region, and in the touch region, an orthographic projection of the touch pattern on the base falling within that of the passivation layer pattern on the base. In the cover plate provided by at least one embodiment of the present disclosure, the passivation layer pattern formed on the touch pattern can effectively prevent touch electrodes in the touch region from being scratched in a (Continued)

subsequent manufacturing process, and therefore a yield rate of a display device is increased.

19 Claims, 4 Drawing Sheets

(51) Int. Cl.
  *H05K 3/46* (2006.01)
  *H05K 3/06* (2006.01)
  *G06F 3/041* (2006.01)
(52) U.S. Cl.
  CPC . *H05K 3/4644* (2013.01); *G06F 2203/04103* (2013.01)

(56) References Cited

U.S. PATENT DOCUMENTS

| | | | |
|---|---|---|---|
| 2011/0279398 A1* | 11/2011 | Philipp | G06F 3/044 345/174 |
| 2012/0013554 A1 | 1/2012 | Nam et al. | |
| 2012/0249465 A1* | 10/2012 | Lin | G06F 3/041 345/173 |
| 2015/0077654 A1* | 3/2015 | Chu | G06F 1/169 349/12 |
| 2015/0153779 A1* | 6/2015 | Ko | G06F 1/1652 345/173 |
| 2015/0162387 A1* | 6/2015 | Gu | G06F 3/0412 345/174 |
| 2017/0146867 A1 | 5/2017 | Wang | |

* cited by examiner

COVER PLATE AND MANUFACTURING METHOD THEREOF, AND MANUFACTURING METHOD OF DISPLAY DEVICE

This application claims priority to and the benefit of Chinese Patent Application No. 201510591094.9 filed on Sep. 16, 2015, which application is incorporated herein in its entirety.

TECHNICAL FIELD

At least one embodiment of the present invention relates to a cover plate and a manufacturing method thereof, and a manufacturing method of a display device.

BACKGROUND

Along with fast progress of display technologies, a display device with a touch function is gradually popular with more and more people due to its advantages such as visual operation and the like. Generally, in a display device, touch electrodes are manufactured on a light-exiting surface of a color filter substrate as a part of the color filter substrate. Thus, on one hand, an overall cell thickness of the display device can be reduced, and on the other hand, manufacturing difficulty can be reduced. But the touch electrodes on the color filter substrate may be scratched in a subsequent process (for example, when other film layers are manufactured on a base of the color filter substrate), and a yield rate of manufacturing the display device is reduced.

SUMMARY

At least one embodiment of the present disclosure provides a cover plate and a manufacturing method thereof, and a method of manufacturing a display device.

At least one embodiment of the present disclosure provides a cover plate comprising: a base, comprising a touch region and a press-fit region disposed outside the touch region; a touch pattern, being disposed in the touch region and the press-fit region; and a passivation layer pattern, being disposed on the touch pattern in the touch region, and in the touch region, an orthographic projection of the touch pattern on the base falling within that of the passivation layer pattern on the base.

For example, according to the cover plate provided by one embodiment of the present disclosure, in the press-fit region, the touch pattern protrudes beyond the passivation layer pattern.

For example, according to the cover plate provided by one embodiment of the present disclosure, a material of the passivation layer pattern comprises at least one of silicon nitride or silicon dioxide.

For example, according to the cover plate provided by one embodiment of the present disclosure, the base comprises a light incident surface and a light-exiting surface opposite to the light incident surface, and the touch pattern is disposed on the light-exiting surface of the base.

For example, according to the cover plate provided by one embodiment of the present disclosure, further comprising a color filter layer disposed on the light incident surface of the base.

For example, according to the cover plate provided by one embodiment of the present disclosure, the touch pattern in the touch region comprises a touch electrode pattern and a touch line pattern.

For example, according to the cover plate provided by one embodiment of the present disclosure, the touch pattern in the press-fit region comprises a touch line pattern.

At least one embodiment of the present disclosure provides a manufacturing method of a cover plate comprising: forming a touch pattern on a base in a touch region and a press-fit region which is disposed outside the touch region; forming a passivation layer pattern on the touch pattern in the touch region; wherein in the touch region, an orthographic projection of the touch pattern on the base falls within that of the passivation layer pattern on the base.

For example, according to the manufacturing method of the cover plate provided by one embodiment of the present disclosure, in the press-fit region, the touch pattern protrudes beyond the passivation layer pattern.

For example, according to the manufacturing method of the cover plate provided by one embodiment of the present disclosure, forming the touch pattern in the touch region and the press-fit region, and forming the passivation layer pattern on the touch pattern in the touch region comprises: forming a touch material layer and a passivation material layer on the base; forming a photoresist layer on the passivation material layer; performing a patterning process to the photoresist layer and obtaining a photoresist removed region, a photoresist completely-reserved region corresponding to the touch pattern in the touch region, and a photoresist partially-reserved region corresponding to the touch pattern in the press-fit region, and obtaining a first photoresist pattern comprising the photoresist layer in the photoresist completely-reserved region and the photoresist partially-reserved region; etching the passivation material layer and the touch material layer with the first photoresist pattern as a mask to obtain an initial passivation layer pattern and a touch pattern corresponding to the photoresist partially-reserved region and the photoresist completely-reserved region; ashing the first photoresist pattern to remove the photoresist layer in the photoresist partially-reserved region and obtain a second photoresist pattern; and etching the initial passivation layer pattern with the second photoresist layer as a mask, and removing the passivation material layer in the press-fit region to obtain the passivation layer pattern.

For example, according to the manufacturing method of the cover plate provided by one embodiment of the present disclosure, performing the patterning process to the photoresist layer and obtaining the photoresist removed region, the photoresist completely-reserved region corresponding to the touch pattern in the touch region, and the photoresist partially-reserved region corresponding to the touch pattern in the press-fit region comprises: performing a partially-exposure process to expose the photoresist layer and performing a developing process to the photoresist layer after being exposed to obtain the photoresist removed region, the photoresist completely-reserved region corresponding to the touch pattern in the touch region, and the photoresist partially-reserved region corresponding to the touch pattern in the press-fit region.

For example, according to the manufacturing method of the cover plate provided by one embodiment of the present disclosure, etching the passivation material layer and the touch material layer with the first photoresist pattern as a mask to obtain the initial passivation layer pattern and the touch pattern corresponding to the photoresist partially-reserved region and the photoresist completely-reserved region comprises: performing a dry etching process on the passivation material layer with the first photoresist pattern as a mask to obtain the initial passivation layer pattern corresponding to the photoresist partially-reserved region and the photoresist completely-reserved region, and then performing a wet etching process on the touch material layer to obtain the touch pattern corresponding to the photoresist partially-reserved region and the photoresist completely-reserved region.

For example, according to the manufacturing method of the cover plate provided by one embodiment of the present disclosure, forming the touch pattern in the touch region and the press-fit region; and forming the passivation layer pattern on the touch pattern in the touch region comprises: forming the touch pattern in the touch region and the press-fit region; and forming the passivation layer pattern on the touch pattern in the touch region by using at least one of silicon nitride or silicon dioxide.

For example, according to the manufacturing method of the cover plate provided by one embodiment of the present disclosure, the base comprises a light incident surface and a light-exiting surface opposite to the light incident surface, and the touch pattern is disposed on the light-exiting surface of the base.

For example, according to the manufacturing method of the cover plate provided by one embodiment of the present disclosure, further comprising: forming a color filter layer on the light incident surface of the base.

For example, according to the manufacturing method of the cover plate provided by one embodiment of the present disclosure, the touch pattern in the touch region comprises a touch electrode pattern and a touch line pattern.

For example, according to the manufacturing method of the cover plate provided by one embodiment of the present disclosure, the touch pattern in the press-fit region comprises a touch line pattern.

At least one embodiment of the present disclosure provides a manufacturing method of a display device comprising fabricating a cover plate by the manufacturing method of the cover plate provided by one embodiment of the present disclosure.

For example, according to the manufacturing method of the display device provided by one embodiment of the present disclosure, further comprising: packaging the base of the cover plate and an array substrate, wherein the cover plate is fabricated after the packaging.

BRIEF DESCRIPTION OF THE DRAWINGS

In order to clearly illustrate the technical solution of the embodiments of the present disclosure, the drawings of the embodiments will be briefly described in the following; it is obvious that the described drawings are only related to some embodiments of the present disclosure and thus are not limitative of the present disclosure.

DETAILED DESCRIPTION

Figure 1:
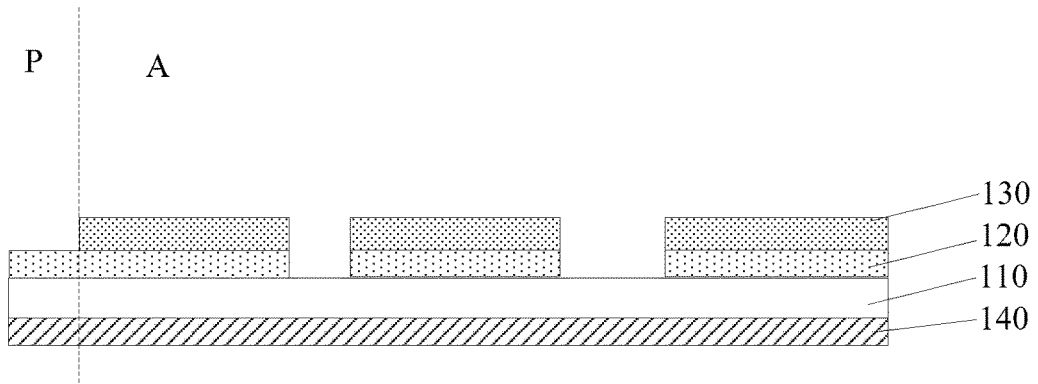
FIG. 1 is a structural schematic diagram of a cover plate provided by one embodiment of the present disclosure.

In order to make objects, technical details and advantages of the embodiments of the present disclosure apparent, the technical solutions of the embodiments will be described in a clearly and fully understandable way in connection with the drawings related to the embodiments of the present disclosure. Apparently, the described embodiments are just a part but not all of the embodiments of the present disclosure. Based on the described embodiments herein, those skilled in the art can obtain other embodiment(s), without any inventive work, which should be within the scope of the present disclosure.

Unless otherwise defined, all the technical and scientific terms used herein have the same meanings as commonly understood by one of ordinary skill in the art to which the present invention belongs. The terms "first," "second," etc., which are used in the description and the claims of the present application for invention, are not intended to indicate any sequence, amount or importance, but distinguish various components. Also, the terms such as "a," "an," etc., are not intended to limit the amount, but indicate the existence of at least one. The terms "comprise," "comprising," "include," "including," etc., are intended to specify that the components or the objects stated before these terms encompass the components or the objects and equivalents thereof listed after these terms, but do not preclude the other components or objects. The phrases "connect", "connected", etc., are not intended to define a physical connection or mechanical connection, but can include an electrical connection, directly or indirectly. "On," "under," "right," "left" and the like are only used to indicate relative position relationship, and when the position of the object which is described is changed, the relative position relationship can be changed accordingly.

In a first aspect, at least one embodiment of the present disclosure provides a cover plate including: a base including a touch region and a press-fit region disposed outside the touch region; a touch pattern being disposed in the touch region and the press-fit region; and a passivation layer pattern being disposed on the touch pattern in the touch region, and in the touch region, an orthographic projection of the touch pattern on the base falling within that of the passivation layer pattern on the base.

In the cover plate provided by at least one embodiment of the present disclosure, the passivation layer pattern formed on the touch pattern can effectively prevent touch electrodes in the touch region from being scratched in a subsequent manufacturing process, and therefore a yield rate of a display device is increased.

In a second aspect, at least one embodiment of the present disclosure further provides a method of manufacturing the cover plate including:

Forming a touch pattern on a touch region and a press-fit region of a base, and forming a passivation layer pattern on the touch pattern in the touch region, wherein, in the touch region, an orthographic projection of the touch pattern on the base falls within that of the passivation layer pattern on the base.

In the cover plate manufactured by using the manufacturing method of the cover plate provided by at least one embodiment of the present disclosure, the passivation layer pattern formed on the touch pattern can effectively prevent touch electrodes in the touch region from being scratched in a subsequent manufacturing process, and therefore a yield rate of a display device is increased.

In a third aspect, at least one embodiment of the present disclosure further provides a method of manufacturing a display device, including: manufacturing a cover plate according to the manufacturing method described in the second aspect.

Fox example, the cover plate can be a color filter substrate provided with a color filter layer, or the cover plate can be a cover plate not provided with a color filter layer, such as a cover plate used in a colored organic light emitting display (OLED). Correspondingly, there may be some differences between a specific structure and a corresponding method of manufacturing the cover plate, and next, a brief description is performed in combination with drawings.

Referring to FIG. 1, it is a structural schematic diagram of a cover plate provided by one embodiment of the present disclosure; the cover plate includes a base 110, a color filter layer 140 formed on a lower surface of the base 110, a touch pattern 120 formed on an upper surface of the base 110, and a passivation layer pattern 130 formed on the touch pattern 120. Fox example, the cover plate or the base of the cover plate can be divided into a touch region A and a press-fit region P, and in the touch region A, an orthographic projection of the touch pattern on the base falls within that of the passivation layer pattern on the base. For example, in the touch region A, the orthographic projection of the touch pattern on the base falls within that of the passivation layer pattern on the base, which includes that the orthographic projection of the touch pattern 120 on the base 110 completely coincides with the orthographic projection of the passivation layer pattern 130 on the base 110, or, in the touch region A, the orthographic projection of the passivation layer pattern on the base is greater than that of the touch pattern on the base. In the press-fit region P, the touch pattern 120 protrudes beyond the passivation layer pattern 130. That is, in the press-fit region P, no passivation layer pattern 130 is formed on the touch pattern 120.

For example, as illustrated in FIG. 1, in the cover plate provided by one embodiment of the present disclosure, in the press-fit region P, the touch pattern protrudes beyond the passivation layer pattern.

For example, in the cover plate provided by one embodiment of the present disclosure, the base 110 includes a light incident surface and a light-exiting surface opposite to the light incident surface, and the touch pattern is disposed on the light-exiting surface of the base. For example, as illustrated in FIG. 1, the light incident surface is the lower surface of the base, and the light-exiting surface is the upper surface of the base.

For example, as illustrated in FIG. 1, the cover plate provided by one embodiment of the present disclosure further includes a color filter layer 140 disposed on the light incident surface of the base 110.

For example, in actual application, a surface (namely the lower surface of the base) of the cover plate provided with the color filter layer may be cell-assembled with an array substrate, and light exiting from the array substrate is incident onto the cover plate from bottom to top and exits from a position above the cover plate. Therefore, a surface of the base provided with the color filter layer is the light incident surface, and a surface of the base provided with the touch pattern is the light-exiting surface. In the cover plate provided by the embodiment, due to the fact that the passivation layer pattern is formed on the touch pattern of the light-exiting surface of the base of the cover plate, and in the touch region, the orthographic projection of the touch pattern on the base of the cover plate falls within that of the passivation layer pattern on the base of the cover plate, the touch pattern can be effectively prevented from being scratched in the subsequent process, and a yield rate of the display device is increased.

Meanwhile, in the embodiment, no passivation layer pattern 130 is formed on the touch pattern 120 in the press-fit region P, and because the touch pattern 120 is exposed in the press-fit region P, it is convenient for a driving circuit to be in press-fit with the touch pattern 120 herein.

For example, a material of the passivation layer pattern 130 can be at least one of silicon nitride or silicon dioxide, or the passivation layer pattern 130 can be made of other insulating materials.

Figure 2:
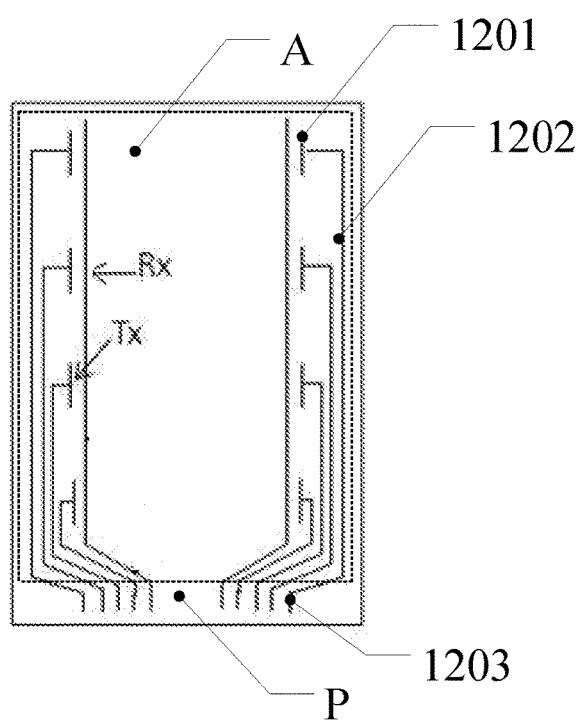
FIG. 2 is a structural schematic diagram of a touch pattern provided by one embodiment of the present disclosure.
Figure 3:
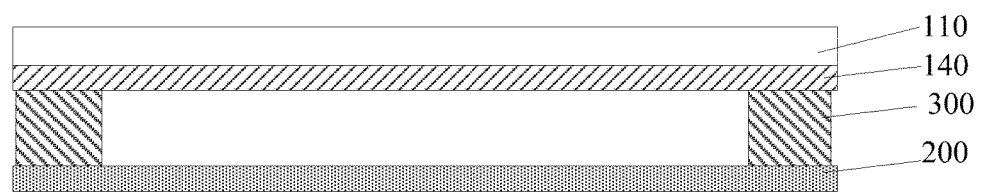
FIGS. 3 to 9 are flow diagrams of a method for manufacturing the cover plate of FIG. 1.
Figure 4:
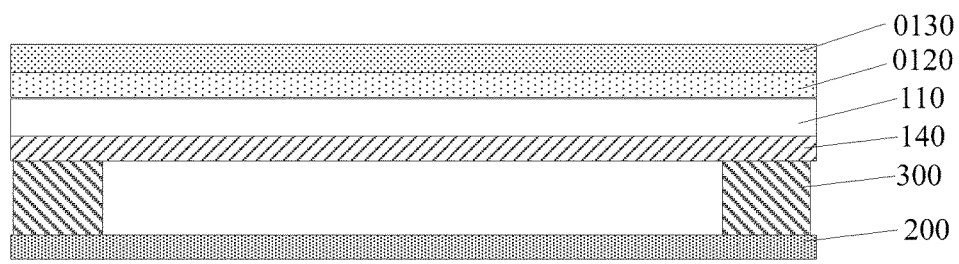

For example, as illustrated in FIG. 2, in the cover plate provided by one embodiment of the present disclosure, the touch pattern 120 in the touch region A includes a touch electrode pattern 1201 and a touch line pattern 1202. For example, as illustrated in FIG. 2, the press-fit region P is located outside the touch region A, and for example, the press-fit region P is located on one side of the touch region A.

For example, as illustrated in FIG. 2, in the cover plate provided by one embodiment of the present disclosure, the touch pattern in the press-fit region P includes a touch line pattern 1203. For example, the touch line pattern 1202 in the touch region A extends into the press-fit region P, to form the touch line pattern 1203 in the press-fit region P.

For example, as illustrated in FIG. 2, the touch pattern 120 in the touch region can include touch driving electrodes Tx and touch sensing electrodes Rx, the touch driving electrodes Tx and the touch sensing electrodes Rx can be formed on a same layer, and for example, the touch driving electrodes Tx and the touch sensing electrodes Rx are formed by a same transparent conductive film layer.

For example, as illustrated in FIG. 2, one side of one touch sensing electrode corresponds to four touch driving electrodes; and the other side of the touch sensing electrode can also be provided with four touch driving electrodes, to form a structure in which one touch sensing electrode corresponds to eight touch driving electrodes. For example, the above structure can serve as a basic touch control unit to be disposed in an array in the touch region. The structure of the touch electrodes is not specifically defined here. For example, the touch driving electrodes and the touch sensing electrodes can be exchanged, and correspondingly, a touch driving signal line and a touch sensing signal line can also be exchanged. For example, when a finger touch causes a change of capacitance between the touch driving electrodes Tx and the touch sensing electrodes Rx, a touch position can be determined by detecting signal output on the touch sensing electrodes Rx caused by coupling of touch driving signals. A touch can be achieved in such mode. Of course, in the touch pattern of the touch region, the touch electrodes are not limited to the condition which is given above and are not limited to a mutual capacitance structure, either, and the touch electrodes can also be a self-capacitance structure, which is not defined by the embodiment of the present disclosure.

In a preparing process of a one glass solution (OGS) touch display panel and an on-cell capacitive touch display panel, after touch patterns are formed, press-fit of a touch flexible printed circuit board (FPC) needs to be performed in the press-fit region. When press-fit of the touch FPC is performed, the touch patterns in the touch region are quite easily scratched, and a product yield is decreased.

Hereinafter, it is illustrated with formation of an on-cell capacitive touch display device as an example.

For example, a manufacturing method of a display device including the cover plate in FIG. 1 can be seen in FIGS. 3 to 9 and includes:

Step S1: forming a color filter layer 140 on a light incident surface of a base 110, and cell-assembling the obtained structure and an array substrate. A structure obtained after the step S1 can be seen with reference to FIG. 3 and includes an array substrate 200, a partially-finished cover plate, and a sealant 300 configured to package the array substrate 200 and the partially-finished cover plate, and the partially-finished cover plate includes the base 110 of the cover plate and the color filter layer 140 formed on the base 110.

Step S2: forming a touch material layer 0120 and a passivation material layer 0130 on a light-exiting surface of the base 110. A structure obtained after the step S2 can be seen with reference to FIG. 4, and compared with FIG. 3, the structure further includes the touch material layer 0120 and the passivation material layer 0130 formed on the base 110.

The touch material layer 0120 can be made of a conductive material, and the passivation material layer 0130 can be made of an insulating material. For example, the touch material layer 0120 can be made of indium tin oxide by a magnetron sputtering process, and the passivation material layer 0130 can be made of silicon nitride or silicon dioxide on the touch material layer 0120 by a vapor deposition process.

Figure 5:
Figure 6:
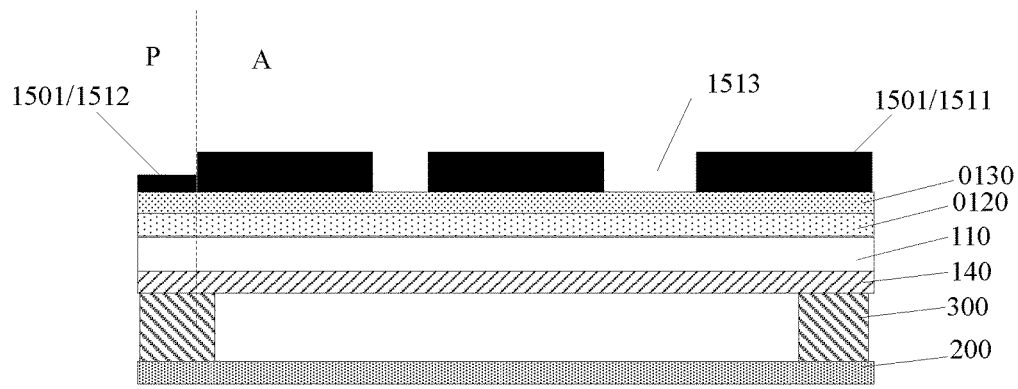
Figure 7:
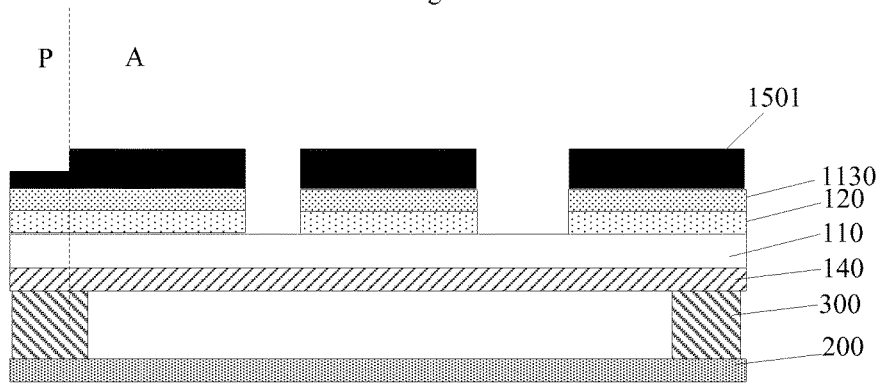
Figure 8:
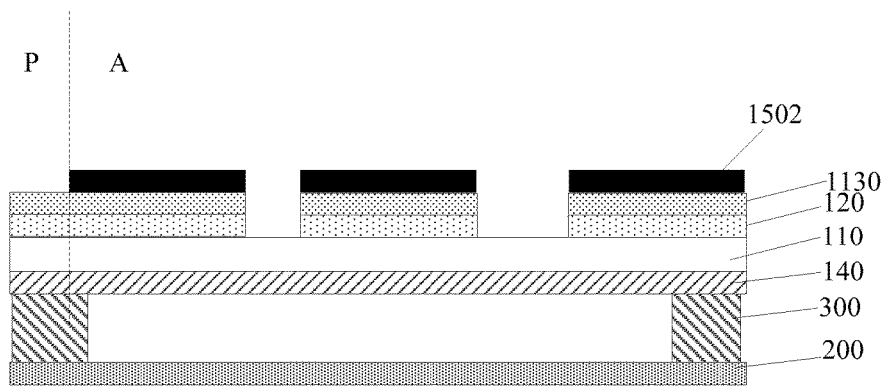
Figure 9:
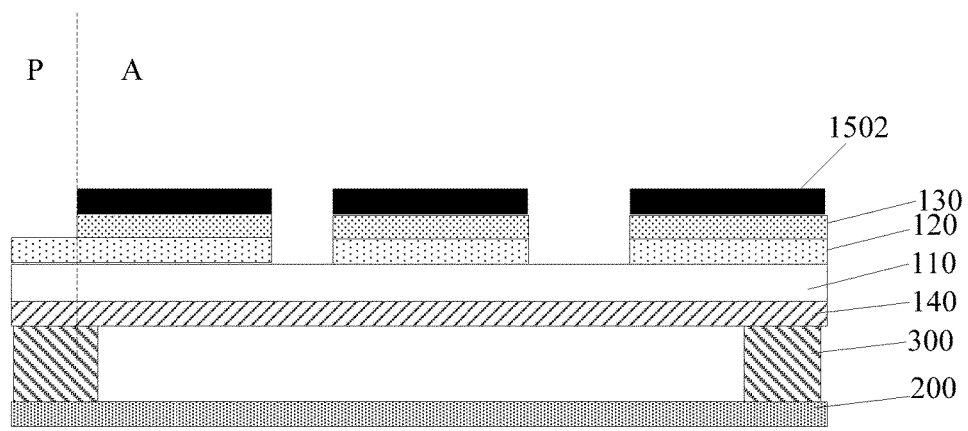

Step S3: forming a photoresist layer 150 on the passivation material layer 0130 as illustrated in FIG. 5, performing a patterning process to the photoresist layer 150 and obtaining a photoresist completely-reserved region 1511 corresponding to the touch pattern in the touch region, a photoresist partially-reserved region 1512 corresponding to the touch pattern in the press-fit region, and a photoresist removed region 1513, to obtain a first photoresist pattern 1501 including the photoresist layer in the photoresist completely-reserved region and the photoresist partially-reserved region. A structure obtained after the step S3 can be seen with reference to FIG. 6, and compared with FIG. 5, the structure is further provided with the photoresist completely-reserved region corresponding to the touch pattern of the touch region, the photoresist partially-reserved region corresponding to the touch pattern of the press-fit region, and the photoresist removed region.

For example, the photoresist layer 150 can be formed on the passivation material layer 0130 by a coating process, and then a patterning process is performed to the photoresist layer 150. For example, performing the patterning process to the photoresist layer 150 may be: patterning the photoresist layer 150 by a partially-exposure process, and therefore corresponding photoresist patterns can be formed by a one-time patterning process, a number of times of patterning process can be reduced, and therefore manufacturing difficulty can be reduced. The partially-exposure process refers to that when exposure is performed on the photoresist layer, total exposure is performed on part of the regions, partial exposure is performed on part of the regions, exposure is not performed on the remaining part of the regions, and therefore more than two states of photoresist regions can be formed in one-time exposure and developing. The partially-exposure process can be achieved with a halftone mask and can also be achieved with a slit mask having slits, and densities of the slits are different in the completely-exposed region and the partially-exposed region. Certainly, the first photoresist pattern can also be obtained by many times of patterning processes, which is not defined in the embodiment of the present disclosure.

Step S4: etching the passivation material layer 0130 and the touch material layer 0120 with the first photoresist pattern 1501 as a mask to obtain an initial passivation layer pattern 1130 and a touch pattern 120 corresponding to the photoresist partially-reserved region and the photoresist completely-reserved region. A structure obtained after the step S4 can be seen with reference to FIG. 7, and compared with FIG. 6, the passivation material layer 0130 and the touch material layer 0120 in a region corresponding to the photoresist completely-removed region are etched.

For example, the step S4 can include: performing a dry etching process on the passivation material layer 0130 with the first photoresist pattern 1501 as a mask to obtain an initial passivation layer pattern corresponding to the photoresist partially-reserved region and the photoresist completely-reserved region, and then performing a wet etching process on the touch material layer 0120 to obtain the touch pattern corresponding to the photoresist partially-reserved region and the photoresist completely-reserved region.

Step S5: ashing the first photoresist pattern 1501 to obtain a second photoresist pattern 1502. For example, ashing treatment can be performed by using a dry etching method, and photoresist layer in the photoresist partially-reserved region is removed. A structure obtained after the step S5 can be seen with reference to FIG. 8, and compared with FIG. 7, photoresist layer in the press-fit region (namely the photoresist partially-reserved region) is removed.

The dry etching method in the step S5 can refer to that a corresponding gas is used for ashing the whole photoresist pattern, and therefore the whole photoresist layer can be thinned till the photoresist of the photoresist partially-reserved region is completely removed.

Step S6: etching the initial passivation layer pattern 1130 with the second photoresist layer 1502 obtained after the step S5 as a mask, and removing the passivation material layer 0130 in the press-fit region P to obtain a passivation layer pattern 130. A structure obtained after the step S6 can be seen with reference to FIG. 9, and compared with FIG. 8, the passivation material layer 0130 in the press-fit region P is etched away.

The photoresist layer 150 can also be stripped off in the step S6, so as to obtain the display device provided with the cover plate in FIG. 1.

Due to the fact that the passivation layer pattern 130 configured to protect the touch pattern 120 is formed in steps S1 to S6, and in the subsequent process, the passivation layer pattern 130 can effectively prevent the touch pattern 120 from being scratched. In the method, the passivation layer pattern 130 and the touch pattern 120 are formed by a same patterning process, and manufacturing difficulty is reduced. In the manufacturing method, the touch pattern 120 and the passivation layer pattern 130 can be formed after cell-assembling is completed, and compared with a mode that a color filter layer 140 is manufactured before cell-assembling, scratches of the color filter layer 140 or the touch pattern 120 and the passivation layer pattern 130 can be avoided.

Certainly, in actual application, the formed cover plate and the array substrate can be cell-assembled after the touch pattern, the passivation layer pattern and the color filter layer are completed, a method for manufacturing the cover plate can include the steps S2 to S6 described above, and besides, before the step S2 or after the step S6, the method can further include a procedure of manufacturing the color filter layer.

In a fourth aspect, one embodiment of the present disclosure further provides a display device including any one of the cover plates described above.

For example, the display device can be an electronic paper, a mobile phone, a watch, a tablet personal computer, a TV set, a display, a notebook computer, a digital photo frame, a navigator or any product or part with a display function.

What needs to explain is that, the display device provided by the embodiments of the present disclosure can be a liquid crystal display device, and can also be an organic light-emitting diode display device or other types of display devices.

What are described above is related to the illustrative embodiments of the disclosure only and not limitative to the protecting scope of the present disclosure. The protecting scopes of the present disclosure are defined by the accompanying claims.

This application claims the benefit of priority from Chinese patent application No. 201510591094.9, filed on Sep. 16, 2015, the disclosure of which is incorporated herein in its entirety by reference as a part of the present application.

What is claimed is:

1. A cover plate comprising:
a base, comprising a touch region and a press-fit region disposed outside the touch region;
a touch pattern, being disposed in the touch region and the press-fit region; and
a passivation layer pattern, being disposed on the touch pattern in the touch region, and in the touch region, an orthographic projection of the touch pattern on the base falling within that of the passivation layer pattern on the base,
wherein, in the touch region, the orthographic projection of the touch pattern on the base and the orthographic projection of the passivation layer pattern on the base are completely overlapped with each other, and
wherein the passivation layer pattern is only disposed in the touch region.

2. The cover plate according to claim 1, wherein in the press-fit region, the touch pattern protrudes beyond the passivation layer pattern.

3. The cover plate according to claim 1, wherein a material of the passivation layer pattern comprises at least one of silicon nitride or silicon dioxide.

4. The cover plate according to claim 1, wherein the base comprises a light incident surface and a light-exiting surface opposite to the light incident surface, and the touch pattern is disposed on the light-exiting surface of the base.

5. The cover plate according to claim 4, further comprising a color filter layer disposed on the light incident surface of the base.

6. The cover plate according to claim 1, wherein the touch pattern in the touch region comprises a touch electrode pattern and a touch line pattern.

7. The cover plate according to claim 1, wherein the touch pattern in the press-fit region comprises a touch line pattern.

8. A manufacturing method of a cover plate comprising:
forming a touch pattern on a base in a touch region and a press-fit region which is disposed outside the touch region; and
forming a passivation layer pattern on the touch pattern in the touch region;
wherein in the touch region, an orthographic projection of the touch pattern on the base falls within that of the passivation layer pattern on the base,
wherein, in the touch region, the orthographic projection of the touch pattern on the base and the orthographic projection of the passivation layer pattern on the base are completely overlapped with each other, and
wherein the passivation layer pattern is only disposed in the touch region.

9. The manufacturing method of the cover plate according to claim 8, wherein in the press-fit region, the touch pattern protrudes beyond the passivation layer pattern.

10. The manufacturing method of the cover plate according to claim 8, wherein forming the touch pattern in the touch region and the press-fit region, and forming the passivation layer pattern on the touch pattern in the touch region comprises:

forming a touch material layer and a passivation material layer on the base;
forming a photoresist layer on the passivation material layer;
performing a patterning process to the photoresist layer and obtaining a photoresist removed region, a photoresist completely-reserved region corresponding to the touch pattern in the touch region, and a photoresist partially-reserved region corresponding to the touch pattern in the press-fit region, and obtaining a first photoresist pattern comprising the photoresist layer in the photoresist completely-reserved region and the photoresist partially-reserved region;
etching the passivation material layer and the touch material layer with the first photoresist pattern as a mask to obtain an initial passivation layer pattern and a touch pattern corresponding to the photoresist partially-reserved region and the photoresist completely-reserved region;
ashing the first photoresist pattern to remove the photoresist layer in the photoresist partially-reserved region and obtain a second photoresist pattern; and
etching the initial passivation layer pattern with a second photoresist layer as a mask, and removing the passivation material layer in the press-fit region to obtain the passivation layer pattern.

11. The manufacturing method of the cover plate according to claim 10, wherein performing the patterning process to the photoresist layer and obtaining the photoresist removed region, the photoresist completely-reserved region corresponding to the touch pattern in the touch region, and the photoresist partially-reserved region corresponding to the touch pattern in the press-fit region comprises:
performing a partially-exposure process to expose the photoresist layer and performing a developing process to the photoresist layer after being exposed to obtain the photoresist removed region, the photoresist completely-reserved region corresponding to the touch pattern in the touch region, and the photoresist partially-reserved region corresponding to the touch pattern in the press-fit region.

12. The manufacturing method of the cover plate according to claim 10, wherein etching the passivation material layer and the touch material layer with the first photoresist pattern as a mask to obtain the initial passivation layer pattern and the touch pattern corresponding to the photoresist partially-reserved region and the photoresist completely-reserved region comprises:
performing a dry etching process on the passivation material layer with the first photoresist pattern as a mask to obtain the initial passivation layer pattern corresponding to the photoresist partially-reserved region and the photoresist completely-reserved region, and then performing a wet etching process on the touch material layer to obtain the touch pattern corresponding to the photoresist partially-reserved region and the photoresist completely-reserved region.

13. The manufacturing method of the cover plate according to claim 8, wherein forming the touch pattern in the touch region and the press-fit region; and forming the passivation layer pattern on the touch pattern in the touch region comprises:
forming the touch pattern in the touch region and the press-fit region; and forming the passivation layer pattern on the touch pattern in the touch region by using at least one of silicon nitride or silicon dioxide.

14. The manufacturing method of the cover plate according to claim 8, wherein the base comprises a light incident surface and a light-exiting surface opposite to the light incident surface, and the touch pattern is disposed on the light-exiting surface of the base.

15. The manufacturing method of the cover plate according to claim 14, further comprising: forming a color filter layer on the light incident surface of the base.

16. The manufacturing method of the cover plate according to claim 14, wherein the touch pattern in the touch region comprises a touch electrode pattern and a touch line pattern.

17. The manufacturing method of the cover plate according to claim 14, wherein the touch pattern in the press-fit region comprises a touch line pattern.

18. A manufacturing method of a display device comprising fabricating a cover plate by the manufacturing method of the cover plate according to claim 8.

19. The manufacturing method of the display device according to claim 18, further comprising: packaging the base of the cover plate and an array substrate, wherein the cover plate is fabricated after the packaging.

* * * * *